United States Patent [19]

Herold et al.

[11] Patent Number: 4,901,033
[45] Date of Patent: Feb. 13, 1990

[54] FREQUENCY SYNTHESIZER WITH DYNAMICALLY PROGRAMMABLE FREQUENCY RANGE OF SELECTED LOOP BANDWITH

[75] Inventors: Barry W. Herold, Boca Raton; Omid Tahernia, Coconut Creek, both of Fla.

[73] Assignee: Motorola, Inc., Schaumburg, Ill.

[21] Appl. No.: 345,809

[22] Filed: May 1, 1989

[51] Int. Cl.[4] .......................... H03L 7/10; H03L 7/18
[52] U.S. Cl. ...................................... 331/1 A; 331/2; 331/8; 331/14; 331/17
[58] Field of Search .................. 331/1 A, 2, 8, 14, 16, 331/17, 25; 455/76, 183, 260; 375/120

[56] References Cited

U.S. PATENT DOCUMENTS

| | | | |
|---|---|---|---|
| 4,167,711 | 9/1979 | Smoot | 331/17 |
| 4,659,999 | 4/1987 | Motoyama et al. | 331/2 |
| 4,745,372 | 5/1988 | Miwa | 331/8 |
| 4,771,249 | 9/1988 | Burch et al. | 331/17 |

OTHER PUBLICATIONS

Specification for NJ88C31, Plessey Co. Pfc, Publication No. PS 2059, May 1986.

*Primary Examiner*—Siegfried H. Grimm
*Attorney, Agent, or Firm*—William E. Zitelli; Vincent B. Ingrassia

[57] ABSTRACT

A frequency synthesizer which includes at least one phase lock loop operative in a selected loop bandwidth state includes a dynamically programmable control circuit for setting the frequency range of its selected loop bandwidth state. In another aspect, the frequency synthesizer may include a plurality of phase lock loop circuits; and a common bias circuit programmably operative to generate at least one bias signal which is coupled commonly to the plurality of phase lock loop circuits for setting a common frequency range for the loop bandwidth states of all of the phase lock loop circuits. In still another aspect, the frequency synthesizer includes a phase lock loop circuit; and a bias circuit programmably operative to generate at least one bias signal which is coupled to the phase lock loop circuit for setting a reference frequency range of the loop bandwidth states thereof, the phase lock loop circuit being dynamically programmable to vary the frequency range settings of the loop bandwidth states in relation to the reference frequency range set by the bias circuit.

15 Claims, 5 Drawing Sheets

FREQUENCY SYNTHESIZER WITH DYNAMICALLY PROGRAMMABLE FREQUENCY RANGE OF SELECTED LOOP BANDWITH

BACKGROUND OF THE INVENTION

The present invention relates to a frequency synthesizer which is dynamically programmable to generate a synthesized frequency signal, and more particularly, to such a frequency synthesizer including at least one phase lock loop operative in a selected loop bandwidth state and including a dynamically programmable control circuit for setting the frequency range of its selected loop bandwidth state.

A frequency synthesizer generally includes at least one phase lock loop comprising the elements of a phase detector, charging circuit, a storage device including a capacitive element, a voltage controlled oscillator, and a frequency divider network. In operation, the phase detector is governed by a very stable reference frequency signal and a feedback frequency signal to generate at least one control signal which governs the charging circuit to source or sink current to and from a capacitive element at a current level (loop bandwidth) to adjust the voltage across the capacitive element of the storage device. The voltage controlled oscillator generates a synthesized frequency signal proportional in frequency to the adjusted voltage. The frequency divider network divides the synthesized frequency down to the feedback frequency signal.

In a programmable frequency synthesizer, the frequency of the synthesized frequency signal is dynamically set by programming the frequency divider network with a coded digital word. Accordingly, a phase lock loop of the frequency synthesizer may be randomly switched between an old and new synthesized frequency signal by programming a different digitally coded word into the frequency divider network.

Each time the phase lock loop is dynamically set to generate a new synthesized frequency signal, the feedback frequency signal is caused to deviate in phase and frequency from the reference frequency signal initially and then relocked thereto within a time interval dictated by the loop bandwidth setting of the phase lock loop. In most phase lock loops, the loop bandwidth is established by setting the current level which the charging circuit uses to adjust the voltage across the capacitive element of the storage device. Most contemporary frequency synthesizers operate with two loop bandwidths or commensurate current level settings. A low loop bandwidth or current level setting is generally established to maintain lock of the synthesized frequency signal to a current synthesized frequency setting. This low setting offers filtering and stability to reduce substantially synthesized frequency jittering as a result of electrical noise either self-induced or otherwise.

In addition, for those applications in which the frequency synthesizer is used in a battery operated portable electronic device, the low current level setting produces little drain on the battery, thus allowing for a longer battery life. However, the low current level setting is not considered adequate for relocking the current synthesized frequency signal to a new frequency setting because, in most applications, the relock time is required to be held to a minimum. Thus, for these purposes, a second wider loop bandwidth setting may be selected in accordance with the relocking operational state of the phase lock loop.

Examples of contemporary phase lock loops having dual loop bandwidth settings are shown and described in the following U.S. Patents:
(1) U.S. Pat. No. 4,167,711 entitled "Phase Detector Output Stage for Phase Locked Loop" issued to George Smoot on Sept. 11, 1979, and
(2) U.S. Pat. No. 4,771,249 entitled "Phase Locked Loop Having a Filter with Controlled Variable Bandwidth" issued to Burch et al. on Sept. 13, 1988, both patents being assigned to the same assignee as the instant application.

While the foregoing described frequency synthesizer with low and high (wide) loop bandwidth settings is adequate for many applications, there may be need for improvement for more recently defined applications. New and greater performance requirements are being imposed for certain applications of frequency synthesizers. For example, in a battery operated electronic device, it is proposed that a frequency synthesizer be capable of randomly selecting between synthesized frequency settings over a very wide scan frequency range, say on the order of a few megahertz, for example, and relocking within a short time duration. Under these specifications, it is recognized that there are conflicting needs. For example, to ensure that the specified relock time is always met, a very high current level may be set for the relocking bandwidth state to meet the worst case condition which is when the synthesized frequency setting is switched from one end of the span frequency range to the other. However, that means that a higher than necessary current level will be used for all other frequency switching conditions creating a higher drain on the battery source of the electronic device for most cases. In addition, because of the wide scan frequency range, an adequate low bandwidth setting for stabilization when operating at one end of the span frequency spectrum may result in an undesirably higher than necessary drain on the battery source when operating at the other end thereof.

It appears that in order to meet the higher performance specifications of the foregoing described type of application, it is of paramount importance to provide a frequency synthesizer capable of being dynamically programmed to vary the frequency range or current level of the selected loop bandwidth state of a phase lock loop thereof. With this capability, each time the frequency synthesizer is programmed with a new synthesized frequency setting, it may also be dynamically programmed with an optimum frequency range for the selected loop bandwidth state in accordance with the new synthesized frequency setting. In so doing, an adequate loop bandwidth setting is assured to meet the rigid specifications of the application while minimizing the current drain on the battery source.

SUMMARY OF THE INVENTION

A frequency synthesizer which is governed by a frequency channel setting to generate a synthesized frequency signal includes a phase lock loop circuit comprising phase detecting means, storage means, oscillator means, frequency dividing means, and adjusting means. The phase detecting means is governed by a reference frequency signal and a feedback frequency signal to generate at least one control signal based on the phase difference between the reference and feedback frequency signals. The oscillator means is controlled by a governing signal maintained by the storage means to generate the synthesized frequency signal proportional in frequency to the amplitude of the governing signal. The frequency dividing means generates the feedback frequency signal by dividing the synthesized frequency signal in accordance with a programmably settable frequency channel setting. Finally, the adjusting means is governed by the at least one control signal to adjust the governing signal in a selected one of a plurality of loop bandwidth states including a first loop bandwidth state which is used to maintain the synthesized frequency signal substantially at the frequency channel setting and a second loop bandwidth state which is used in response to a new frequency channel setting to converge the synthesized frequency signal to the new frequency channel setting. In accordance with one aspect of the present invention, the adjusting means includes a digitally programmable control circuit for dynamically setting the frequency range of the selected loop bandwidth state in one of a predetermined plurality of frequency ranges, whereby an appropriate loop bandwidth frequency range may be dynamically set in accordance with a new frequency channel setting.

In accordance with another aspect of the present invention, the frequency synthesizer may comprise a plurality of phase lock loop circuits, each governed by a respective frequency channel setting to generate a synthesized frequency signal; and a common bias circuit programmably operative to generate at least one bias signal which is coupled commonly to the plurality of phase lock loop circuits for setting a common frequency range for the first and second loop bandwidth states of all of the phase lock loop circuits.

In accordance with yet another aspect of the present invention, the frequency synthesizer may include a phase lock loop circuit such as that described above; and a bias circuit programmably operative to generate at least one bias signal which is coupled to the phase lock loop circuit for setting a reference frequency range of the first and second loop bandwidth states thereof, the phase lock loop circuit including a dynamically programmable control circuit for varying the frequency range setting of the first and second loop bandwidth states in relation to the reference frequency range set by the bias circuit.

DESCRIPTION OF THE PREFERRED EMBODIMENT

Figure 1:
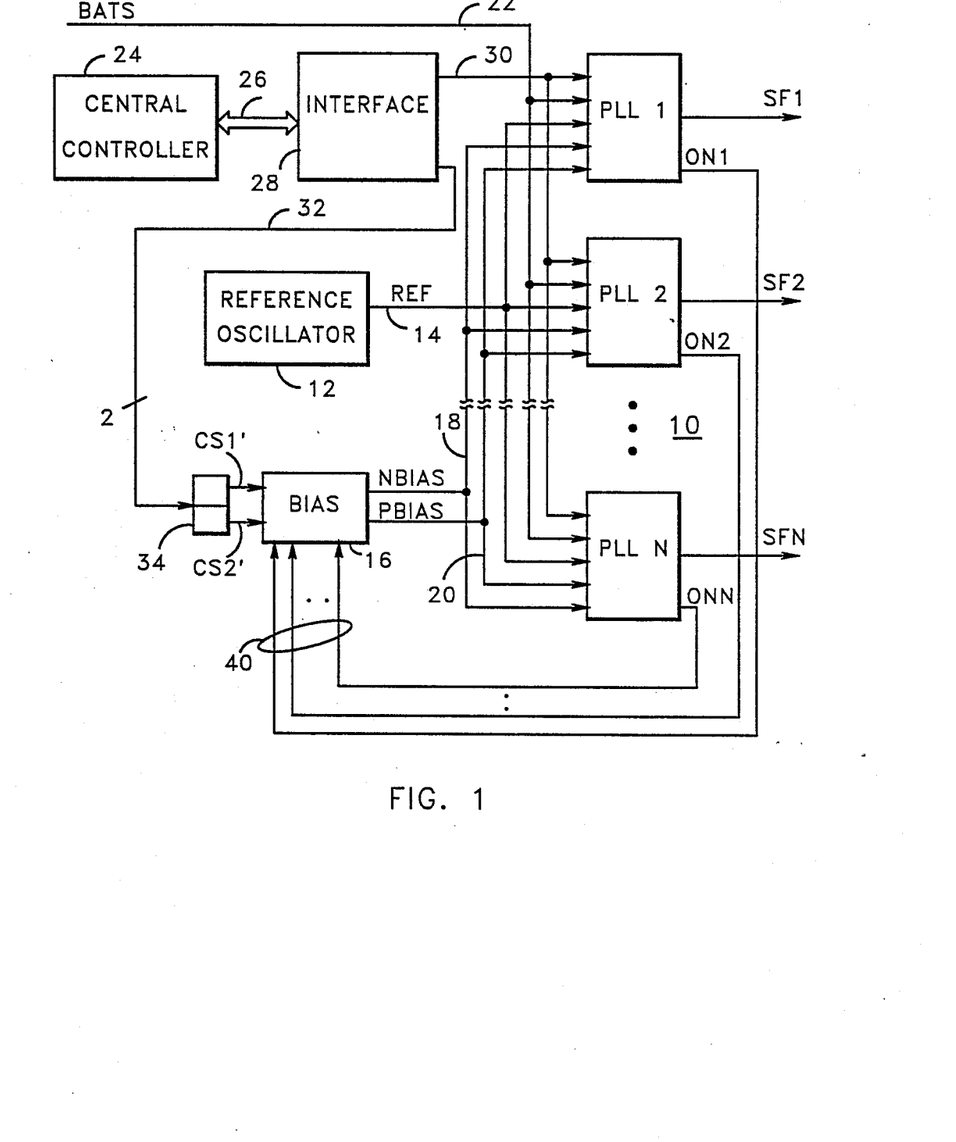
FIG. 1 is a block diagram schematic of a frequency synthesizer suitable for embodying all of the aspects of the present invention.

Referring to FIG. 1, a frequency synthesizer 10 may include at least one phase lock loop denoted as PLL 1. In the instant embodiment, the synthesizer 10 is shown to include a plurality of phase lock loops further including the loops denoted as PLL 2 through PLL N. All of the phase lock loops of the frequency synthesizer 10 are of similar design and will be described herebelow in connection with the embodiment depicted by the functional block diagram schematic of FIG. 2. A common reference oscillator circuit 12 generates a very stable reference frequency signal REF which is provided commonly to the plurality of phase lock loops over signal line 14. A common bias circuit 16 is programmably operative to generate at least one bias reference signal which is coupled commonly to the plurality of phase lock loops. In the present embodiment, two bias reference signals are generated by the common bias circuit 16 and denoted as NBIAS and PBIAS which are coupled commonly to the phase lock loops over signal lines 18 and 20, respectively. Still further, a battery saving signal denoted as BATS is also commonly coupled to the phase lock loop circuits over a signal line 22.

A central controller 24, which may be a programmed microcomputer system, for example, conducts coded digital words over a controller bus 26 and through an interface circuit 28 to be distributed commonly to all of the phase lock loop circuits over signal lines 30 and also to the common bias circuit over signal lines 32. The digitally coded words conducted over signal lines 30 and 32 may be of a parallel format, serial format, or a combination of both.

In the present embodiment, a two-bit digital word is conducted over the signal lines 32 and stored in a storage register 34 for dynamically programming the common bias circuit 16. Signal lines CS1' and CS2' provide the status of the two bits of register 34 to the bias circuit 16 for setting the value of the bias reference signals which operation will be described in greater detail in connection with the embodiment depicted by the circuit schematic of FIG. 4.

Further in the present embodiment, a two-bit digital word may be provided over the signal lines 30 to be dynamically programmed into a storage register 36 (see FIG. 2) of each of the phase lock loop circuits. Also, 32 bits of data may be serially conducted over the signal lines 30 and stored in a 32-bit memory 38 (see FIG. 2) of each of the phase lock loop circuits. The aforementioned digital words of the signal line 30 are provided to the phase lock loop circuits for dynamically programming the synthesized frequency setting, loop bandwidth state, and frequency range thereof of each of the phase lock loop circuits. This will be described in greater detail hereinbelow.

Still further, the battery saving signal 22 includes both sleep and awake cycles which are used to control the operations of the phase lock loops to reduce current drain on a battery source (not shown) during sleep cycles thereof. In response to the awake cycles of the battery saving signal 22, the phase lock loop circuits generate respective signals ON 1, ON 2, . . . , ON N which are conducted over signal lines 40 to the bias circuit 16 to likewise control the current drain thereof on the battery source.

Figure 2:
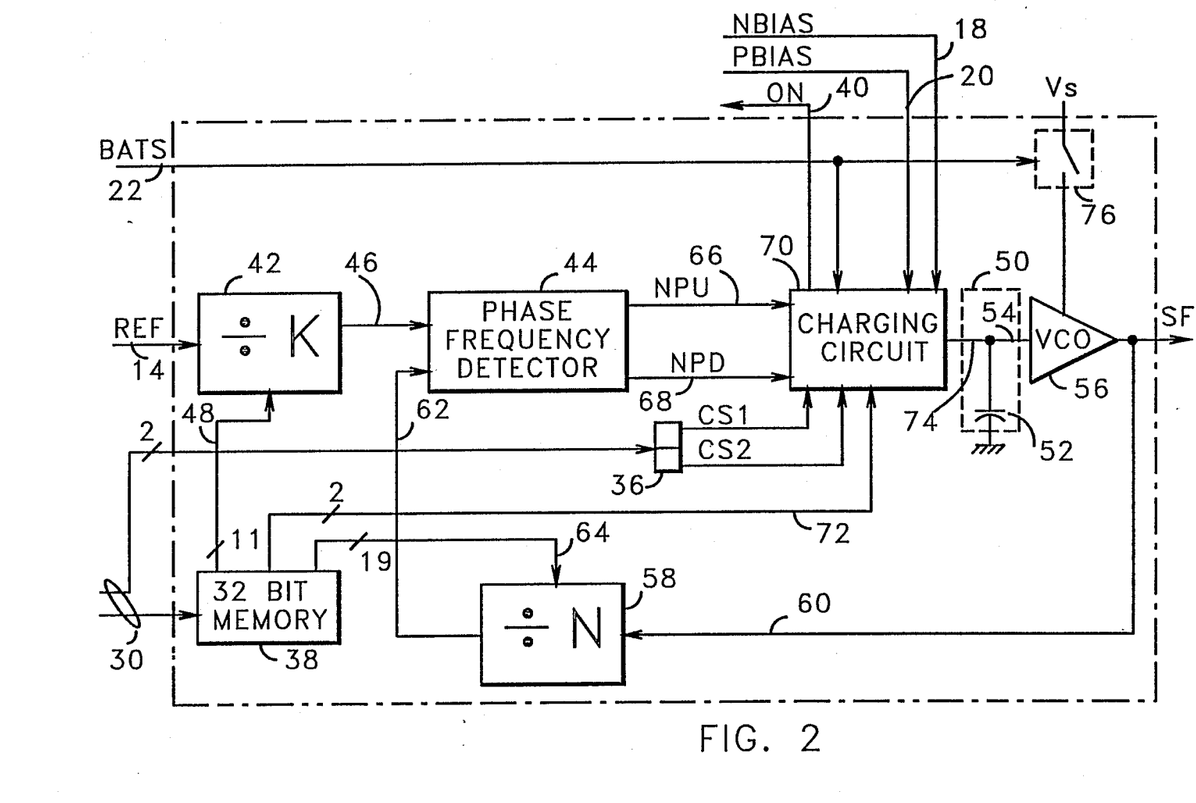
FIG. 2 is a block diagram schematic of a phase lock loop circuit suitable for use in the embodiment of FIG. 1.

A suitable embodiment of a phase lock loop for use in the frequency synthesizer 10 of FIG. 1 will be described in connection with the functional block diagram schematic depicted in FIG. 2. Referring to FIG. 2, the frequency signal conducted over signal line 14 is coupled to a divide by K divider network to develop a reference frequency signal which is conducted to a phase/frequency detector 44 over signal line 46. The value of K is programmed by a portion of the 32-bit word stored in the register 38. In the present embodiment, 11 bits are distributed to the network 42 over signal lines 48 for setting the value of K.

A storage device 50 which includes a capacitive element 52 is disposed in the phase lock loop circuit for maintaining a voltage potential across the capacitive element 52. A signal representative of the voltage potential is conducted over signal line 54 to a voltage controlled oscillator 56 to govern the operation thereof. The oscillator 56 generates a synthesized frequency signal SF having a frequency proportional to the amplitude of the governing voltage signal 54. The synthesized frequency signal is conducted to an input of a divide by N frequency divider circuit 58 over signal line 60. The resultant frequency divided signal which will hereinafter be referred to as the feedback frequency signal is coupled to another input of the phase frequency detector 44 over signal line 62. The value of N of the frequency divider network 58 is set by a portion of the 32-bit digital word stored in the register 38. In the present embodiment, 19 bits of the 32-bit digital word are distributed to the circuit 58 over the signal lines 64 for setting the value of N.

In response to the phase difference between the reference frequency signal 46 and feedback frequency signal 62, the phase detector 44 generates at least one control signal. In the present embodiment, the phase detector generates control signals denoted as NPU and NPD which are conducted over signal lines 66 and 68, respectively, to a charging circuit 70. In addition, the common bias reference signals of signal lines 18 and 20 are also conducted to the charging circuit 70. Still further, signals CS 1 and CS 2 representative of the status bits of the register 36 are also coupled to the charging circuit 70. Still further, the last two bits of the 32-bit digital word stored in register 38 are conducted to the charging circuit over signal lines 72 and may be used to set the loop bandwidth state of the phase lock loop as will be described in greater detail in connection with the embodiment depicted in FIG. 3A. The charging circuit 70 is coupled to the capacitive element 52 over signal line 74 to source and sink current to and from the capacitive element SW to adjust the voltage thereacross.

The battery saving signal over signal line 22 may be coupled to the charging circuit 70 and also to a control input of a switch 76 which is coupled between the battery source denoted as Vs and the power supply input of the voltage control oscillator 56. During sleep cycles of the signal 22, switch 76 is opened to prevent current drain from the battery source for operation of the oscillator 56, and conversely, during awake cycles, the switch 76 is closed to power the oscillator 56 from the battery source Vs. As will be described in greater detail herebelow, the charging circuit 70 operates in response to the battery saving signal 22 to generate the signal ON over signal line 40 which is conducted to the common bias circuit 16 (see FIG. 1).

Figure 3A:
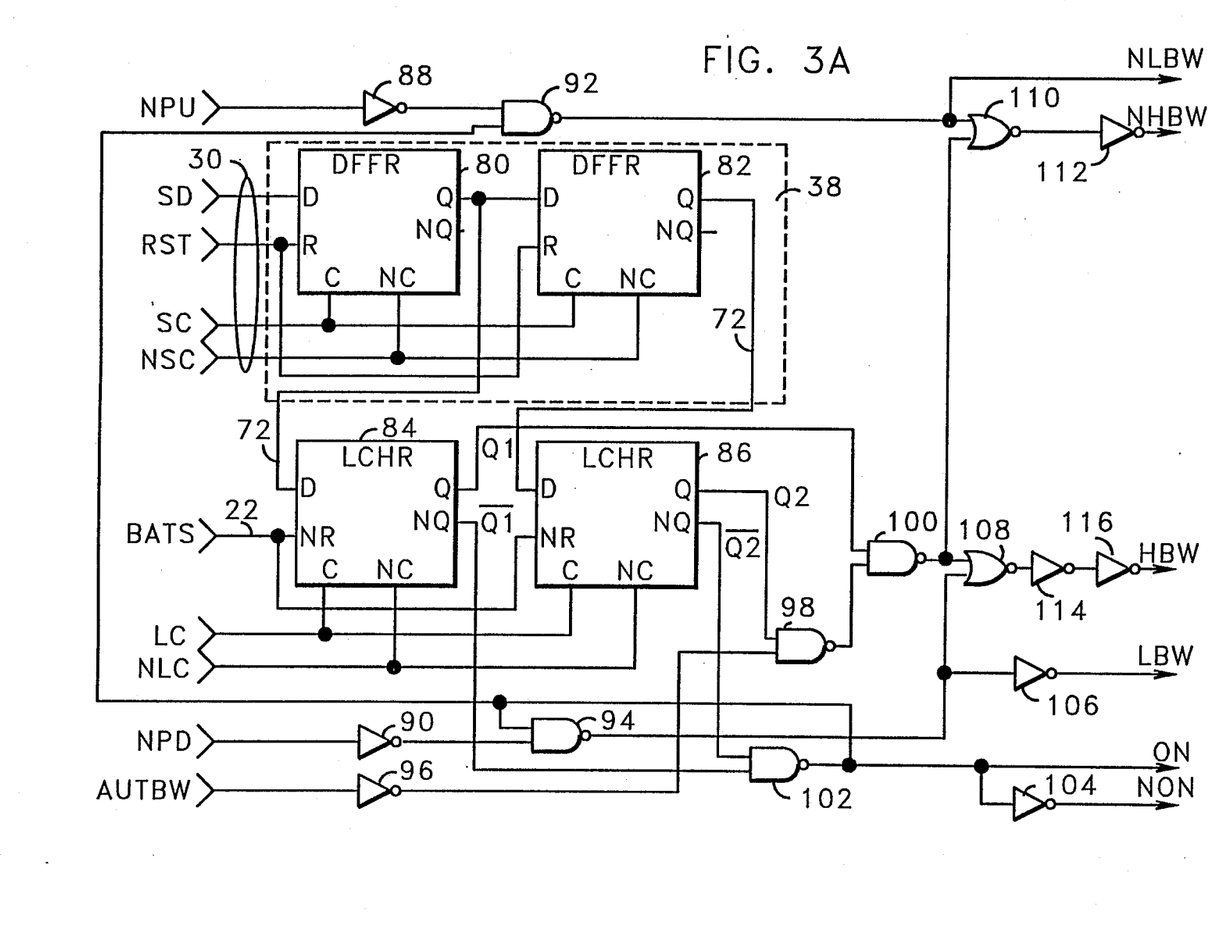
FIGS. 3A and 3B are, in combination, a circuit schematic of a charging circuit suitable for use in the phase lock loop embodiment of FIG. 2.

The charging circuit 70 may be considered as divided into two parts, one being a logical control section and the other being an analog charging section. FIG. 3A depicts a suitable embodiment of the logical control section of the charging circuit 70. A section of the memory 38 containing the two bits of information which are conducted over signal lines 72 to the charging circuit 70 is depicted in FIG. 3A for completeness. D-type flip-flops 80 and 82 are included in the memory section 38 to store the two bits of data which govern the selection of the low and high loop bandwidth states (i.e. current levels). Control commands which are coupled over signal lines 30 from the central controller 24 via interface 28 include a serial data path SD for providing serial digital data to the D-type flip-flops of the section 38. In addition, complementary clocking signals SC and NSC are part of the signal lines 30 and used to clock the D-type flip-flops of the memory section 38 in order to store the serial digital data provided over line SD. Still further, a reset signal RST is provided as part of the control commands to reset the flip-flops of the memory section 38.

The digital data bits 72 which set the loop bandwidth state (current levels) are conducted to corresponding D-type latches 84 and 86 of the charging circuit as depicted in FIG. 3A. In addition, the battery saver signal BATS over signal line 22 is coupled to a reset input of each of the latches 84 and 86. Still further, complementary clocking signals LC and NLC are coupled to the flip-flops 84 and 86 to provide control for the storage of the respective digital bits therein. The stored digital data bits of flip-flops 84 and 86 will hereinafter be referred to as Q1 and Q2, respectively, and their complements will hereinafter be referred to as $\overline{Q1}$ and $\overline{Q2}$.

Referring to FIG. 3A, the control signals NPU and NPD supplied from the phase detector 44 to govern the sourcing and sinking of current to the capacitive element 52 are coupled respectively through inverter gates 88 and 90 to one input of NAND gates 92 and 94, respectively. An auto bandwidth signal AUTBW is coupled through an inverter gate 96 to one input of another NAND gate 98. Another input of the NAND gate 98 is coupled to the signal line of Q2. The signal line of Q1 is coupled to one input of another NAND gate 100 which has another input thereof coupled to the output of the NAND gate 98. The signal lines of $\overline{Q1}$ and $\overline{Q2}$ are coupled to two inputs of a NAND gate 102, the output of which effecting the signal ON which is coupled through an inverter gate 104 to effect the complement NON thereof. The signal ON is coupled to the common bias circuit 16 for use therein as will be described in greater detail in connection with the embodiment of FIG. 4 herein below. The output of NAND gate 102 may also be coupled to another input of NAND gates 92 and 94.

The output of NAND gate 94 is coupled through an inverter gate 106 to effect a control signal LBW and also coupled to one input of a NOR gate 108. In addition, the output of the NAND gate 100 is coupled to another input of the NOR gate 108 and to an input of another NOR gate 110. Still further, the output of the NAND gate 92 effects a control signal NLBW and is coupled to the other input of the NOR gate 110. Finally, the output of the NOR gate 110 is coupled through an inverter gate 112 to produce another control signal NHBW, and the output of the NOR gate 108 is coupled through a pair of cascaded inverter gates 114 and 116 to effect still another control signal HBW. The control signals NLBW, NHBW, HBW, and LBW are used in the charging circuit 70 to control MOSFET switches for the sourcing and sinking of current over signal line 74 to the storage capacitor 52 to adjust the voltage thereacross.

Figure 3B:
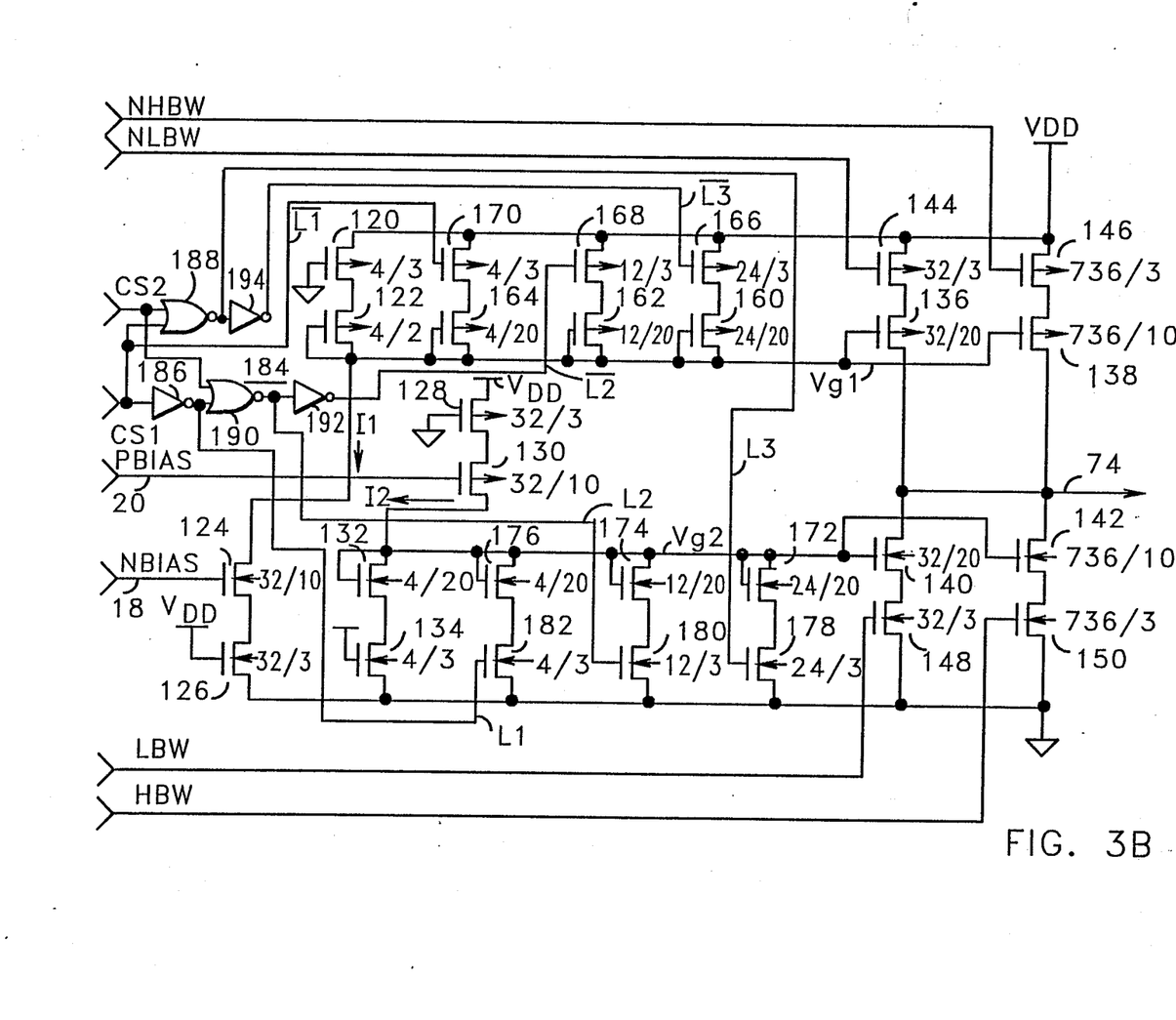

More specifically, referring to FIG. 3B which depicts a suitable embodiment of the analog changing section, MOSFET transistors are constructed in a circuit arrangement to form current mirrors which set the low and high current levels for the low loop bandwidth and high loop bandwidth phase lock loop states, respectively. The numbers shown alongside each of the MOSFET transistors represent their respective width over length ratios. The combination of MOSFET transistors 120, 122, 124, and 126 are coupled in tandem between the battery supply VDD and ground to effect a bias current I1 for the current mirrors of the current sourcing stages. The value of the sourcing bias current I1 is set by a bias voltage NBIAS which is programmably generated by the common bias circuit 16 and applied to the gate of the transistor 124.

Similarly, a tandem arrangement of MOSFET transistors 128, 130, 132, and 134 coupled between the supply voltage VDD and ground effects a bias current I2 for the current sinking mirror circuits. Moreover, the value of the bias current I2 is set by a bias voltage PBIAS which is also programmably generated by the common bias circuit 16 and applied to the gate of the transistor 130.

Still further, a voltage Vg1 is produced at the drain of the diode configured MOSFET transistor 122 and is coupled to the gates of two MOSFET transistors 136 and 138 to produce a current mirroring effect thereat. That is, the sourcing current level conducted through transistor 136 is an amplification of the bias current I1 based on the width to length ratios (gain relationship) of the transistors 122 and 136. In the present embodiment, this ratio was set at a value of 8 (low loop bandwidth state). Similarly, the sourcing current level conducted through the transistor 138 is also an amplification of the bias current I1 for the same reasons, and for the present embodiment, the amplification was set at 400 (high loop bandwidth state).

In the same manner, a voltage Vg2 is effected at the source of the diode configured MOSFET transistor 132 in accordance with the value of the bias current I2. The voltage signal Vg2 is coupled to the gates of two MOSFET transistors 140 and 142 to produce the current mirroring effects (gain relationship) for the sinking current levels in both the low loop bandwidth and high loop bandwidth states as that described above for the transistors 136 and 138. For the present embodiment, the amplification settings for the transistors 140 and 142 are substantially the same as those set for transistors 136 and 138, respectively.

MOSFET transistors 144 and 146 are coupled between the transistors 136 and 138, respectively, and the voltage supply VDD. The switches 144 and 146 are controlled by the respective signals NLBW and NHBW to conduct and not conduct low and high level sourcing current through the transistors 136 and 138, respectively. Hereinafter, the coupled transistor pair 136 and 144 will be referred to as SW1 and the coupled pair of transistors 138 and 146 will be referred to as SW2. In a similar manner, the MOSFET transistors 148 and 150 are coupled between their respective transistors 140 and 142 and ground potential. The transistors 148 and 150 are controlled by the signals LBW and HBW to conduct and not conduct low and high level sinking current through their respectively coupled transistors 140 and 142. Hereinafter, the coupled pairs 140, 148 and 142, 150 will be referred to as SW3 and SW4, respectively.

In operation, in a low loop bandwidth state, source current may be supplied to or drained from the capacitive element 52 via signal line 74 through SW1 and SW3 as controlled by the signals NLBW and LBW, respectively. On the other hand, in a high loop bandwidth state, sourcing current is supplied through both SW1 and SW2 and sinking current is conducted through SW3 and SW4 as controlled by the signals NHBW and HBW, respectively. For the present embodiment, the design is such that when both signals NHBW and NLBW are both logical 1's and signals LBW and HBW are both logical 0, all of the switches SW1, SW2, SW3, and SW4 are off, creating a floating state at the conduction line 74. This floating state may be created during a sleep cycle of the battery saving signal BATS in order to maintain the voltage across the capacitive element 52.

More specifically, referring to FIG. 3A, when the battery saving signal BATS is at a logical 0 state which represents a sleep cycle thereof, the flip-flops 84 and 86 are reset which sets the signals $\overline{Q1}$ and $\overline{Q2}$ to a logical 1. In response, the output of NAND gate 102 is effected to a logical 0 (i.e. the ON signal is set to logical 0) which disables the NAND gates 92 and 94 effecting a logical 1 at the outputs thereof. This results in a logical 1 and a logical 0 over the control signals NLBW and LBW, respectively, which turns switches SW1 and SW3 off and also results in a logical 1 and logical 0 for the signals NHBW and HBW, respectively, which also turns switches SW2 and SW4 off. Accordingly, with all of these switches off, the charging circuit 70 is inhibited from adjusting the voltage across the capacitive element 52 which state continues for the duration of the sleep cycle of the battery saving signal BATS. Conversely, when the battery saving signal BATS is changed to a logical 1 representative of the commencement of an awake cycle, the NAND gates 92 and 94 are enabled to thereafter respond to their respective control signals NPU and NPD (see FIG. 3A).

The remaining operations of the charging circuit 70 which are controlled by the control signals NPU and NPD and the data signals Q1, Q2, and auto bandwidth (A) in a selectable one of either the low or high loop bandwidth states is defined for the present embodiment by the truth table 1 provided directly here below.

TRUTH TABLE 1

| A | Q1 | Q2 | NPU | NPD | LBW | HBW | NLBW | NHBW | SW1 | SW2 | SW3 | SW4 |
|---|----|----|-----|-----|-----|-----|------|------|-----|-----|-----|-----|
| X | 1 | 0 | 1 | 0 | 1 | 1 | 1 | 1 | OFF | OFF | ON | ON |
| X | 0 | X | 1 | 0 | 1 | 0 | 1 | 1 | OFF | OFF | ON | OFF |
| 1 | 1 | 1 | 1 | 0 | 1 | 1 | 1 | 1 | OFF | OFF | ON | ON |
| 0 | 1 | 1 | 1 | 0 | 1 | 0 | 1 | 1 | OFF | OFF | ON | OFF |
| X | 1 | 0 | 0 | 1 | 0 | 0 | 0 | 0 | ON | ON | OFF | OFF |
| X | 0 | X | 0 | 1 | 0 | 0 | 0 | 1 | ON | OFF | OFF | OFF |
| 1 | 1 | 1 | 0 | 1 | 0 | 0 | 0 | 0 | ON | ON | OFF | OFF |
| 0 | 1 | 1 | 0 | 1 | 0 | 0 | 0 | 1 | ON | OFF | OFF | OFF |

In accordance with one aspect of the present invention, a plurality of switchable diode sections are included as part of the current mirror cirucits of the embodiment of the charging circuit 70 as shown in FIG. 3B. The combination of the programmable register 36, control signals CS1 and CS2, and the additional switchable diode sections of the mirror circuits comprise a digitally programmable control circuit for dynamically setting the frequency range of the selected loop bandwidth state in one of a predetermined plurality of frequency ranges. More specifically, MOSFET transistors 160, 162, and 164 are configured as diodes and disposed in tandem with their respective switchable MOSFET transistors 166, 168, and 170 between the voltage supply bus VDD and the drain of MOSFET transistor 122. In this configuration, the switchable diode sections 160, 166; 162, 168; and 164, 170 are all in parallel with each other and in parallel with the non-switchable diode section comprising MOSFET transistors 120 and 122.

Also, in a similar configuration, MOSFET transistors 172, 174, and 176 are connected as diode elements in tandem with their respective MOSFET switches 178, 180, and 182 between ground potential and the source of MOSFET transistor 132. In this arrangement, the switchable diode sections 172, 178; 174, 180; and 176, 182 are in parallel with each other and in parallel with the non-switchable diode section comprising MOSFET transistors 132 and 134.

The plurality of switchable diode sections may be controlled by the programmed code of the digital signals CS1 and CS2 as decoded by a decoder circuit shown at 184. More specifically, the digital signal CS1 is coupled to an input of an inverter gate 186, to one input of a NOR gate 188 and to the gate of the MOSFET switch 170 over signal line denoted as $\overline{L1}$. The output of the inverter gate 186 is coupled to one input of a NOR gate 190 and also to the gate of the MOSFET switch 182 over a signal line denoted as L1. The digital signal CS2 is coupled to one input of both of the NOR gates 188 and 190. In addition, the output of the NOR gate 190 is coupled to the gate of the MOSFET switch 180 over a signal line denoted as L2 and also to the gate of the MOSFET switch 162 via an inverter gate 192 and a signal line denoted as $\overline{L2}$. Still further, the output of the NOR gate 188 is coupled to the gate of the MOSFET switch 178 over a signal line denoted as L3 and also to the gate of the MOSFET switch 166 via an inverter gate 194 and a signal line denoted as $\overline{L3}$.

In this configuration, the switchable diode sections comprising the MOSFET switches 164, 170 and 176, 182 are switched concurrently to conduct and not conduct bias current therethrough by the signal L1 and its converse $\overline{L1}$. Similarly, the switchable diode sections comprising the MOSFET transistors 162, 168 and 174, 180 are controlled concurrently to conduct and not conduct bias current by the signals L2 and $\overline{L2}$; and likewise, the switchable diode sections of 160, 166 and 172, 178 are controlled concurrently by the signals L3 and $\overline{L3}$.

In the present embodiment, the MOSFET transistors of the diode sections have a particular width to length ratio design as denoted by the ratios drafted alongside each transistor as depicted in the drawing of FIG. 3B. The principle of operation of the present embodiment is such that when a diode section is switched to conduct its respective bias current, the level of which being set by the voltage signals PBIAS and NBIAS, the width to length ratio of the conducting MOSFET transistors are additive to the width to length ratio of the MOSFET of its respective non-switching section to alter the gain relationship of its respective current mirror circuit to vary the current level of a selected loop bandwidth state for both of the current sourcing and sinking conditions.

For example, when the digital states of the signals CS1 and CS2 are both a logical 0, the sourcing switching diode sections 160 and 164 are switched on and the diode section 162 off and similarly, the sinking switchable diode sections 172 and 176 are conducted on and the switchable diode section 174 is switched off. The addition of their respective ratios yields a ratio of 32/20 which is in a 1:1 relationship with the low bandwidth state output sections yielding a gain relationship of unity for the low bandwidth state. Under these same conditions, the high bandwidth state will have a gain relationship with the bias current of approximately 50 times that of the low bandwidth state. Accordingly, in the present embodiment, the frequency range of the selected loop bandwidth state set by CS1, CS2 being 0,0, respectively, is approximately ⅛ of the common frequency range set by the common bias circuit using the voltage values of the signals PBIAS and NBIAS. The other settable frequency ranges or gain relationships (the two being synonymous in the present embodiment) corresponding to the coded digital states of the signals CS1 and CS2 are shown in the truth table 2 found directly here below.

TRUTH TABLE 2

| CS1 | CS2 | L1,$\overline{L1}$ | L2,$\overline{L2}$ | L3,$\overline{L3}$ | Gain Relationship (LBW) |
|---|---|---|---|---|---|
| 0 | 0 | ON | OFF | ON | X1 |
| 1 | 0 | OFF | ON | OFF | X2 |
| 0 | 1 | ON | OFF | OFF | X4 |
| 1 | 1 | OFF | OFF | OFF | X8 |

Figure 4:
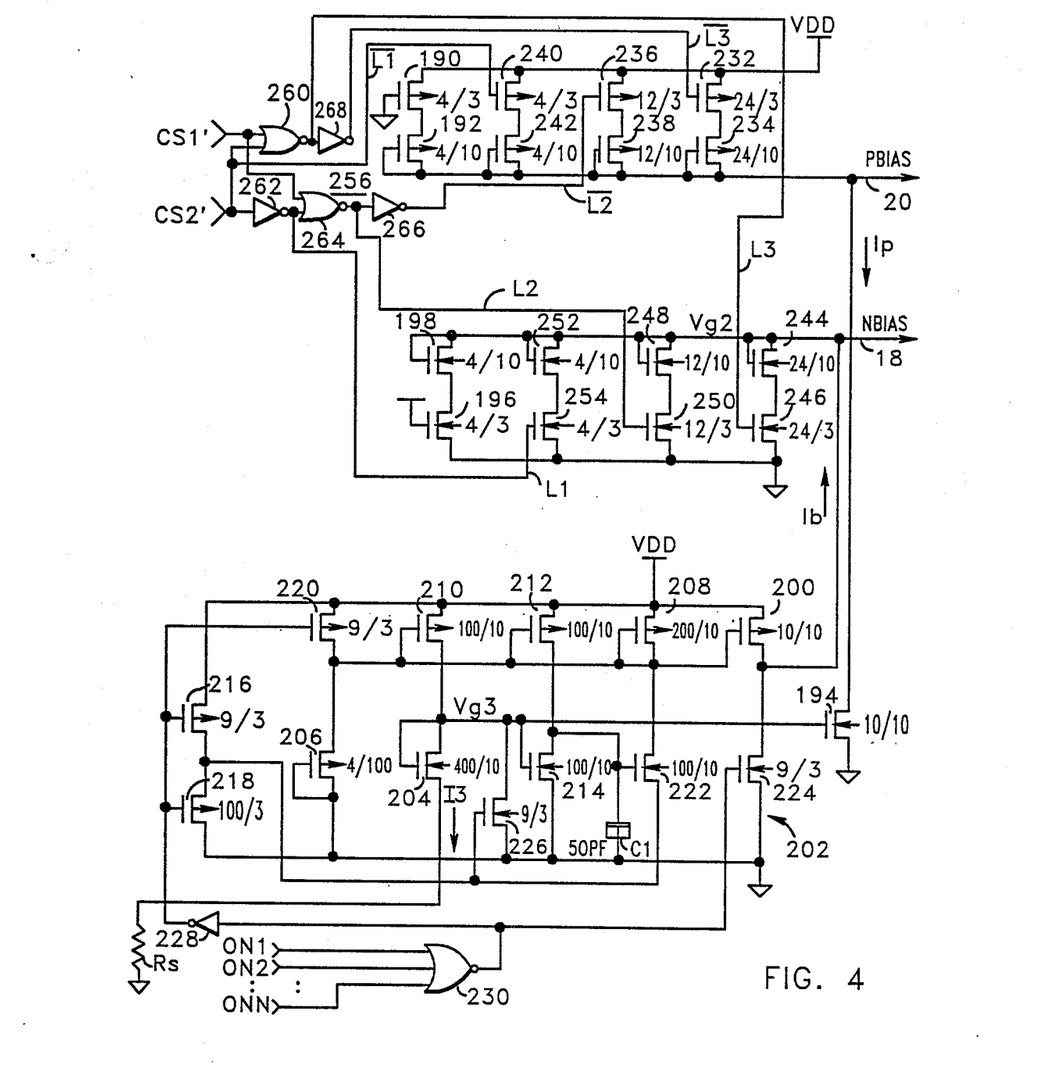
FIG. 4 is a circuit schematic of a programmable bias circuit suitable for use in the frequency synthesizer embodiment of FIG. 1.

FIG. 4 depicts a circuit schematic of a suitable embodiment for the bias circuit 16 which is programmably controlled by the digital word comprising, for the present embodiment, the digital signals CS1' and CS2' to dynamically set a common or maximum frequency range of the selected loop bandwidth state of at least one phase lock loop circuit (refer to the functional block diagram schematic of FIG. 1). Referring to FIG. 4, a non-switchable diode section comprising MOSFET transistors 190 and 192 is coupled between the voltage supply VDD and the signal line 20. Another MOSFET transistor 194 is coupled between the signal line 20 and ground potential. Similarly, another non-switchable diode section comprising the transistors 196 and 198 is coupled between ground potential and the signal line 18. In addition, a MOSFET transistor 200 is coupled between the voltage supply VDD and the signal line 18. In the present embodiment, the circuit arrangement 202 establishes very stable and fixed voltage levels at the gates of transistors 194 and 200 to fix the respective bias currents Ip and Ib therethrough for setting the voltage levels of the PBIAS and NBIAS bias reference signals. Accordingly, the common or maximum frequency range setting for the selected loop bandwidth state of the phase lock loops is commensurate with the voltage levels of the aforementioned bias reference signals as described hereabove in connection with FIG. 3B.

More specifically, the circuit arrangement 202 comprises a diode configured MOSFET transistor 204 coupled between the gate of transistor 194 and a resistor Rs which is coupled to ground potential. Another MOSFET transistor 206 is configured as a diode and coupled between the gate of transistor 200 and ground potential. Yet another diode configured MOSFET transistor 208 is coupled between the voltage supply VDD and the gate of transistor 200. Still further, a MOSFET transistor 210 is coupled between the voltage supply VDD and the gate of transistor 194. The gate of transistor 210 is coupled to the gate of transistor 200. A pair of MOS- FET transistors 212 and 214 are coupled in tandem between the voltage supply VDD and ground potential. The gate of transistor 212 is coupled to the gate of transistor 200 and the gate of transistor 214 is coupled to the gate of transistor 194. Another pair of MOSFET transistors 216 and 218 are tandemly coupled between the voltage supply VDD and ground potential. Another MOSFET transistor 220 is coupled between VDD and the gate of transistor 200. Other MOSFET transistors 222 and 224 are coupled between the gate of transistor 200 and the node between the transistors 216 and 218 and between the drain of transistor 200 and ground potential, respectively. Still another MOSFET transistor 226 is coupled between the gate of transistor 194 and ground potential. The gate of transistor 222 is coupled to he node connection between transistors 212 and 214 and also to a capacitor C1 which is coupled to ground potential. The value of capacitor C1 may be on the order of 50 pf for the present embodiment. The gate of transistor 226 is also coupled to the node connection between transistors 216 and 218. The gates of transistors 216, 218, and 220 are commonly coupled to the output of an inverter gate 228. In addition, the output of a NOR gate 230 is coupled to the gate of transistor 224 and also to the input of the inverter gate 228. The "ON" signals generated from the phase lock loop circuits are coupled to respective inputs of the NOR gate 230.

In operation, let us assume that at least one of the "ON" signals is at a logical 1 which maintains activation of the bias circuit 16. In this state, the output of the NOR gate 230 is at a logical 0 and the output of the inverter gate 228 is at a logical 1. Under these conditions, transistors 216, 220, and 224 are in a blocking state and transistor 218 is in a shorted state providing a ground path for transistor 222 and blocking transistor 226.

In this activated state, a bias current I3 is established through the diode section 204 by the value of the resistor Rs. This bias current sets a voltage Vg3 at the gates of transistors 194 and 214. Transistor 212 establishes a drain current such that there exists a voltage swing applied to the gate of transistor 222 as a result of the voltage gain between the transistors 214 and 204. The voltage at the gate of transistor 222 is translated into another bias current conducted through the diode section 208 and which is mirrored through the transistor stages 210 and 212 in accordance with the gain relationship with transistor 208. The current conducted through the transistor 210 and 212 feed the transistor sections 204 and 214 which provides a positive feedback that stabilizes at a point where the total voltage across the transistor 204 and resistor Rs is equal to the total voltage across the transistor 214 to ground. The capacitance C1 provides filtering to stabilize the positive feedback loop and keep it from going into oscillation. In the present embodiment, it is contemplated that the bias current I3 be set at approximately 10 $\mu$A such that due to the current mirror relationships, the bias currents Ip and Ib through the transistors 194 and 200, respectively, will stabilize at approximately 1 $\mu$A each. Here again, the width to length design ratios of the MOSFET transistors are shown alongside each in the drawing of FIG. 4.

With all of the "ON" signals at a logical 0 state which should occur responsively to the sleep cycles of the battery saving signal, the bias circuit 16 is deactivated. More specifically, the output of the NOR gate 230 is set to a logical 1 which causes the output of the inverter gate 228 to be set to a logical 0. Under these conditions, the transistors 216, 220, and 224 are caused to be shorted and the transistors 218, 222, and 226 are caused to be blocked. In response, the signal line 18 is brought to ground through the transistor 224 and since the transistor 194 is blocked by the shorting of transistor 210, the signal line 20 is allowed to be pulled up to the supply voltage VDD by the diode section 190, 192. Consequently, with the signal line 20 at VDD and the signal line 18 at ground potential, the charging circuits 70 of the phase lock loop circuits are effected to their floating states to maintain the voltage across the capacitive element 52.

In accordance with another aspect of the present invention, a plurality of diode sections are coupled between the supply voltage VDD and the signal line 20 and also between the signal line 18 and ground potential. The switchable diode sections may be dynamically switched in accordance with the programmed code of the digital signal CS1' and CS2' to set the voltage of the NBIAS and PBIAS signals which establish a common or maximum frequency range for the selected loop bandwidth state of all of the phase lock loop circuits.

More specifically, tandemly coupled pairs of MOSFET transistors 232, 234; 236, 238; and 240, 242 are configured in parallel with each other and in parallel with the non-switchable diode section 190, 192 between the voltage supply VDD and the signal line 20. In a similar configuration, tandemly coupled MOSFET transistors 244, 246; 248, 250; and 252, 254 are coupled in parallel together and with the non-switchable diode section 196, 198 between the signal line 18 and ground potential.

A decoder circuit 256 is provided in the bias circuit for decoding the digital codes of the signals CS1' and CS2' to permit a corresponding selection of the plurality of diode sections to establish the corresponding voltage level desired at the signal lines 18 and 20. More specifically, the digital signal CS2' is coupled to one input of a NOR gate 260, to the gate of the switching transistor 240 over a signal line denoted as $\overline{L1}$ and also to the gate of the switching transistor 254 through an inverter gate 262 and over a signal line denoted as L1. In addition, the digital signal CS1' is coupled to another input of the NOR gate 260 and to one input of another NOR gate 264. The output of the inverter gate 262 is coupled to another input of the NOR gate 264. The output of the NOR gate 264 is coupled to the gate of the switching transistor 250 over a signal line denoted as L2 and also to the gate of the switching transistor 236 through an inverter gate 266 and over a signal line denoted as $\overline{L2}$. Further, the output of the NOR gate 260 is coupled to the gate of the switching transistor 246 over a signal line denoted as L3 and also to the gate of the switching transistor 232 through an inverter 268 and over a signal line denoted as $\overline{L3}$.

In the present embodiment, the decoded switching signal and its complement concurrently controls the corresponding diode section. For example, L1 and $\overline{L1}$ concurrently control the diode section 240, 242 and the diode section 252, 254 to source and sink bias current set by the transistors 194 and 200, respectively. Accordingly, under these control conditions, the voltage levels set for the PBIAS and NBIAS bias reference signals are substantially the same. Thus, the programmable control operation of the bias circuit 16 may be shown by a truth table such as that found in the truth table 3 shown here below.

TRUTH TABLE 3

| CS1 | CS2 | L1,L̄1 | L2,L̄2 | L3,L̄3 | Bias Voltage Level |
|---|---|---|---|---|---|
| 1 | 1 | OFF | OFF | OFF | 1 |
| 1 | 0 | ON | OFF | OFF | ½ |
| 0 | 1 | OFF | ON | OFF | ¼ |
| 0 | 0 | ON | OFF | ON | ⅛ |

To summarize the operation of the frequency synthesizer described in connection with the FIGS. 1-4, the central controller 24 may set a new individual frequency channel setting for each of the phase lock loops 1 through N by dynamically programming a serialized digital word (via the interface 28 and signal lines 30) in each of the storage registers 38 thereof. The particular loop bandwidth state may also be set by the central controller 24 within the serialized digital data word based on the new frequency channel setting for each phase lock loop. Within each phase lock loop circuit, the programmed digital word of the storage register 38 is distributed to the appropriate circuits as described in connection with the embodiment of FIG. 2 to set the new frequency channel setting and new loop bandwidth state utilizing the signal lines 48, 64, and 72.

In addition, the central controller 24 may also set a common or maximum frequency for the selected loop bandwidth states of all of the phase lock loops by dynamically programming a digitally coded word (via the interface 28 and signal lines 32) in the storage register 34. The resulting digital signals CS1' and CS2' control the bias circuit as described hereabove in connection with the embodiment of FIG. 4 to establish the appropriate voltage levels for the bias reference signals NBIAS and PBIAS which are conducted to the charging circuits 70 of the various phase lock loop circuits to govern the setting of the common or maximum current levels therein as described in connection with the embodiment of FIG. 3B.

Still further, the central controller 24 may also dynamically program the individual frequency ranges of the selected loop bandwidth states of the various phase lock loops by conducting individual two-bit coded words CS1, CS2 over the signal lines 30 to each of the phase lock loops for storage in the register 36 thereof. The resulting digital states of the signals CS1 and CS2 control the plurality of diode sections within each of the charging circuits 70 of the various phase lock loops to govern dynamically and individually the setting of the frequency range of the selected loop bandwidth state thereof.

While the present invention has been described hereabove in connection with a particular embodiment depicted in FIGS. 1-4, it is understood that modifications, additions, and substitutions may be made to the embodiment without deviating from the broad principles of the present invention. Accordingly, the present invention should not be limited to that described for any single embodiment, but rather construed in accordance with the broad scope and breadth of the recitation of the appended claims.

What is claimed is:

1. A frequency synthesizer governed by a frequency channel setting to generate a synthesized frequency signal, said frequency synthesizer including a phase lock loop (PLL) circuit operative in a first loop bandwidth state to maintain said synthesized frequency signal substantially at said frequency channel setting, said PLL circuit programmably settable randomly between old and new frequency channel settings, said PLL circuit operative in a second loop bandwidth state in response to a new frequency channel setting to converge the synthesized frequency signal to said new frequency channel setting, said PLL circuit comprising:

phase detecting means governed by a reference frequency signal and a feedback frequency signal to generate at least one control signal based on the phase difference between said reference and feedback frequency signals;

storage means for maintaining a governing signal;

oscillator means controlled by said governing signal to generate said synthesized frequency signal proportional in frequency to the amplitude of said governing signal;

means for frequency dividing said synthesized frequency signal in accordance with a programmably settable frequency channel setting to generate said feedback frequency signal;

means governed by said at least one control signal to adjust the governing signal of said storage means in a selected one of a plurality of loop bandwidth states including said first and second loop bandwidth states, said adjusting means including a digitally programmable control circuit for dynamically setting the frequency range of the selected loop bandwidth state in one of a predetermined plurality of frequency ranges, whereby an appropriate loop bandwidth frequency range may be dynamically set in accordance with a new frequency channel setting.

2. The frequency synthesizer in accordance with claim 1 wherein the storage means includes a capacitive element for maintaining a governing voltage potential thereacross; wherein the adjusting means includes first means selectable for sourcing and sinking current to and from said capacitive element at a first current level for adjusting the voltage thereacross as governed by the at least one control signal, and second means selectable for sourcing and sinking current to and from said capacitive element at a second current level for adjusting the voltage thereacross as governed by the at least one control signal; said first means being selected for said first loop bandwidth state and said second means being selected for said second loop bandwidth state, said first and second current levels being set by at least one bias reference signal; and wherein the control circuit is digitally programmable to dynamically vary said first and second current levels to one of a predetermined plurality of other current levels corresponding to the predetermined plurality of frequency ranges of the selected loop bandwidth.

3. The frequency synthesizer in accordance with claim 2 wherein each of the first and second means includes a current mirror circuit comprising a diode section, a current generating section governed by the at least one bias reference signal to generate a bias current through said diode section, and an output section which has a gain relationship with said diode section to effect the sourcing and sinking current at the respective one of the first and second current levels which is a magnification of said respective bias current in accordance with the respective gain relationship; and wherein the control circuit includes a plurality of additional switchable diode sections for each of the current mirror circuits, selected ones of said switchable diode sections made operative by the programmed code of a digital word to vary the first and second current levels of said output sections to a current level corresponding to said programmed digital code.

4. The frequency synthesizer in accordance with claim 3 wherein the control circuit further includes a storage register for dynamically programming the PLL circuit with a coded digital word, a decoder coupled to said storage register and having a plurality of signal outputs which are coupled respectively to the plurality of switchable diode sections, said decoder operative to decode the dynamically programmed digital word of said storage register and render selected diode sections operative by said corresponding signal outputs in accordance with the decoded programmed digital word.

5. The frequency synthesizer in accordance with claim 2 including a digitally programmable bias circuit for dynamically setting the at least one bias reference signal to one of a predetermined plurality of amplitude levels.

6. The frequency synthesizer in accordance with claim 5 wherein the adjusting means includes logic means governed by a battery saving signal having sleep and awake cycles to generate a signal responsive to said sleep and awake cycles; and wherein the bias circuit is rendered active and inactive by said generated signal to set the at least one bias reference signal.

7. A frequency synthesizer comprising:
a plurality of phase lock loop (PLL) circuits, each PLL circuit governed by a respective frequency channel setting to generate a synthesized frequency signal, each PLL circuit operative in a first loop bandwidth state to maintain its synthesized frequency signal substantially at its respective frequency channel setting, each PLL circuit programmably settable randomly between old and new frequency channel settings, each PLL circuit operative in a second loop bandwidth state in response to a new frequency channel setting to converge its synthesized frequency signal to said new frequency channel setting; and a common bias circuit programmably operative to generate at least one bias signal which is coupled commonly to said plurality of PLL circuits for setting a common frequency range for the first and second loop bandwidth states of all of the PLL circuits.

8. The frequency synthesizer in accordance with claim 7 wherein each PLL circuit includes a dynamically programmable control circuit for varying individually the frequency range setting for its respective first and second loop bandwidth states in relation to the common frequency range set by the common bias circuit.

9. The frequency synthesizer in accordance with claim 7 wherein each PLL circuit includes first logic means governed by a battery saving signal having sleep and awake cycles to generate a signal responsive to said sleep and awake cycles; and wherein the common bias circuit includes second logic means governed said signals generated by the PLL circuits to render active and inactive the setting of the at least one bias reference signal.

10. The frequency synthesizer in accordance with claim 7 wherein the common bias circuit includes a current mirror circuit comprising a diode section, a current generating section biased to generate a bias current through said diode section, an output section which has a gain relationship with said diode section to effect the at least one bias reference signal, and a plurality of switchable diode sections, selected ones of said switchable diode sections made to conduct bias current by the programmed code of a digital word to cause a variation in the amplitude of the at least one bias reference signal effected by said output section.

11. A frequency synthesizer including:
a phase lock loop (PLL) circuit governed by a frequency channel setting to generate a synthesized frequency signal, said PLL circuit operative in a first loop bandwidth state to maintain said synthesized frequency signal substantially at said frequency channel setting said PLL circuit programmably settable randomly between old and new frequency channel settings, said PLL circuit operative in a second loop bandwidth state in response to a new frequency channel setting to converge the synthesized frequency signal to said new frequency channel setting; and
a bias circuit programmably operative to generate at least one bias signal which is coupled to said PLL circuit for setting a reference frequency range of the first and second loop bandwidth states thereof, said PLL circuit including a dynamically programmable control circuit for varying the frequency range settings of the first and second loop bandwidth states in relation to the reference frequency range set by said bias circuit.

12. The frequency synthesizer in accordance with claim 11 wherein the phase lock loop circuit includes:
phase detecting means governed by a reference frequency signal and a feedback frequency signal to generate at least one control signal based on the phase difference between said reference and feedback frequency signals;
a capacitive element for maintaining a governing voltage potential thereacross;
oscillator means controlled by said governing voltage potential to generate said synthesized frequency signal proportional in frequency to the amplitude of said voltage potential;
means for frequency dividing said synthesized frequency signal in accordance with a programmably settable frequency channel setting to generate said feedback frequency signal;
adjusting means including first means selectable for sourcing and sinking current to and from said capacitive element at a first current level for adjusting the voltage thereacross as governed by the at least one control signal, and second means selectable for sourcing and sinking current to and from said capacitive element at a second current level for adjusting the voltage thereacross as governed by the at least one control signal, said first means being selected for said first loop bandwidth state and said second means being selected for said second loop bandwidth state, said first and second current levels being set by at least one bias reference signal; and
wherein the control circuit is digitally programmable to dynamically vary said first and second current levels to one of a predetermined plurality of lesser current levels corresponding to a predetermined plurality of frequency ranges of the selected loop bandwidth within the reference frequency range set by the bias circuit.

13. The frequency synthesizer in accordance with claim 12 wherein each of the first and second means includes a current mirror circuit comprising a diode section, a current generating section governed by the at least one bias reference signal to generate a bias current through said diode section, and an output section which has a gain relationship with said diode section to effect the sourcing and sinking current at the respective one of the first and second current levels which is a magnification of said respective bias current in accordance with the respective gain relationship; and wherein the control circuit includes a plurality of additional switchable diode sections for each of the current mirror circuits, selected ones of said switchable diode sections made operative by the programmed code of a digital word to attenuate the first and second current levels of said output sections to a lesser current level corresponding to said programmed digital code.

14. The frequency synthesizer in accordance with claim 13 wherein the control circuit further includes a storage register for dynamically programming the PLL circuit with a coded digital word, a decoder coupled to said storage register and having a plurality of signal outputs which are coupled respectively to the plurality of switchable diode sections, said decoder operative to decode the dynamically programmed digital word of said storage register ad render selected diode sections operative by said corresponding signal outputs in accordance with the decoded programmed digital word.

15. The frequency synthesizer in accordance with claim 11 wherein the bias circuit includes a current mirror circuit comprising a diode section, a current generating section biased to generate a bias current through said diode section, an output section which as a gain relationship with said diode section to effect the at least one bias reference signal, and a plurality of switchable diode sections, selected ones of said switchable diode sections made to conduct bias current by the programmed code of a digital word to cause a variation in the amplitude of the at least one bias reference signal effected by said output section.

* * * * *